United States Patent
Yang

(10) Patent No.: US 9,268,209 B2
(45) Date of Patent: Feb. 23, 2016

(54) MASK AND METHOD OF FORMING PATTERN BY USING THE SAME

(71) Applicant: UNITED MICROELECTRONICS CORP., Hsin-Chu (TW)

(72) Inventor: Yu-Shiang Yang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/591,937

(22) Filed: Jan. 8, 2015

(65) Prior Publication Data

US 2015/0128099 A1    May 7, 2015

Related U.S. Application Data

(62) Division of application No. 13/471,430, filed on May 14, 2012, now Pat. No. 8,962,221.

(51) Int. Cl.
  *G03F 1/36* (2012.01)
  *G03F 1/38* (2012.01)
  *G06F 17/50* (2006.01)

(52) U.S. Cl.
  CPC .. *G03F 1/36* (2013.01); *G03F 1/38* (2013.01); *G06F 17/5068* (2013.01)

(58) Field of Classification Search
  CPC .......... G03F 1/36; G03F 1/38; G06F 17/5068
  USPC ........................................... 430/5
  See application file for complete search history.

(56) References Cited

U.S. PATENT DOCUMENTS

| | | | |
|---|---|---|---|
| 5,725,972 A | 3/1998 | Takeshita | |
| 6,033,811 A | 3/2000 | Lee | |
| 6,395,438 B1 | 5/2002 | Bruce | |
| 6,470,489 B1 | 10/2002 | Chang | |
| 6,684,382 B2 | 1/2004 | Liu | |
| 6,753,115 B2 | 6/2004 | Zhang | |
| 6,763,514 B2 | 7/2004 | Zhang | |
| 6,818,480 B2 | 11/2004 | Lee | |
| 6,852,453 B2 | 2/2005 | Wu | |
| 6,961,920 B2 | 11/2005 | Zach | |
| 7,386,829 B2 | 6/2008 | Lee | |
| 7,624,369 B2 | 11/2009 | Graur | |
| 7,682,757 B2 | 3/2010 | Mashita | |
| 2005/0238966 A1 | 10/2005 | Nolscher | |
| 2006/0066339 A1 | 3/2006 | Rajski | |
| 2006/0085772 A1 | 4/2006 | Zhang | |
| 2006/0161452 A1 | 7/2006 | Hess | |
| 2007/0054197 A1 | 3/2007 | Yen | |
| 2008/0138588 A1 | 6/2008 | Schroeder | |
| 2009/0193385 A1 | 7/2009 | Yang | |
| 2009/0278569 A1 | 11/2009 | Taoka | |
| 2009/0300576 A1 | 12/2009 | Huang | |
| 2010/0036644 A1 | 2/2010 | Yang | |
| 2010/0070944 A1 | 3/2010 | Wu | |
| 2010/0086862 A1 | 4/2010 | Yang | |
| 2010/0131914 A1 | 5/2010 | Wu | |
| 2010/0175041 A1 | 7/2010 | Krasnoperova | |
| 2011/0029939 A1 | 2/2011 | Yang | |

FOREIGN PATENT DOCUMENTS

| | | |
|---|---|---|
| TW | 200301511 | 7/2003 |
| TW | 200422795 | 11/2004 |
| TW | 200625001 | 7/2006 |
| TW | 200639578 | 11/2006 |
| TW | 201017749 | 5/2010 |

*Primary Examiner* — Christopher Young
(74) *Attorney, Agent, or Firm* — Winston Hsu; Scott Margo

(57) ABSTRACT

A method of forming a pattern is disclosed. At first, a layout pattern is provided to a computer system. The layout pattern includes at least a first strip pattern and at least a second strip pattern, and a width of the second strip pattern is substantially larger than a width of the first strip pattern. Subsequently, the second strip pattern neighboring the first strip pattern is defined as a selected pattern. Then, an assist pattern is formed in the selected pattern, and the assist pattern does not overlap a center line of the selected pattern. The layout pattern and the assist pattern are further outputted through the computer system onto a mask.

9 Claims, 5 Drawing Sheets

US 9,268,209 B2

MASK AND METHOD OF FORMING PATTERN BY USING THE SAME

CROSS REFERENCE TO RELATED APPLICATIONS

This application is a division of U.S. application Ser. No. 13/471,430 filed May 14, 2012, and incorporated herein by reference in its entirety.

BACKGROUND OF THE INVENTION

1. Field of the Invention

The present invention relates to a mask and a method of forming a pattern, and more particularly, to a mask having an assist pattern and a method of forming a pattern by using the same mask.

2. Description of the Prior Art

With the trend of miniaturization of the electronic products and peripherals, research about thin structures and high integration of the semiconductor devices have become the essential subjects and developing aspects in the industry, and the lithography technology plays an important role to determine the performances of the semiconductor devices.

In semiconductor manufacturing processes, the integrated circuit layout is first designed and formed as a mask pattern. The mask pattern is then proportionally transferred to a photoresist layer disposed on the semiconductor wafer through an exposure process followed by a development process. Subsequently, a corresponding etching process is performed in order to manufacture the semiconductor devices on the semiconductor wafer. With the demand of increasing integration of semiconductor devices, the design rule of line width and spaces between lines or devices becomes finer. However, due to the optical proximity effect (OPE), the width is subject to optical limitations. To obtain the fine-sized devices, the pitch i.e. the interval between transparent regions in a mask is scaled down along with the device size. However, if the pitch is scaled down to a specific range, for example, equal to or smaller than half of the wavelength of light used in the exposure process, when the light passes through the mask, diffraction and interferences may occur, and the resolution of the mask pattern transferred onto the photoresist layer would be affected; in other words, due to the OPE, the deviation of the transferred pattern such as rounded right-angle corners, shortened line-ends, or increase/decrease of line widths would occur. Furthermore, when light passes through the transparent regions of a mask having different interval sizes or different mask pattern densities, the light through the regions having small interval sizes is influenced by the transparent regions having large interval sizes, which may result in the deformation of the transferred pattern or a micro-loading effect.

To overcome the illustrated problems, in the prior art dummy patterns are disposed in the spaces between the transparent regions having different interval sizes, so that when the mask pattern is transferred to the photoresist layer, the pattern deviation caused by the OPE may occur in the dummy patterns only, and the integrity of the predetermined transferred pattern can be achieved. In another solution, scattering bars are disposed in the spaces between the transparent regions having different interval sizes, and the deposition of scattering bars prevents the transferred pattern corresponding to the transparent regions having small interval size from being affected by the OPE effect. Nevertheless, the dummy patterns will be transferred to photoresist layer, and the feasible utilization rate of the semiconductor wafer may decrease. Moreover, the deposition of scattering bars reduces the feasible utilization rate of the mask and increases the layout budget of mask. Consequently, when the mask includes the transparent regions having different interval sizes, a way to obtain the complete transferred patterns corresponding to the transparent regions having small interval size is still an important issue in the field.

SUMMARY OF THE INVENTION

An objective of the present invention is therefore to provide a mask including an assist pattern and a method of forming a pattern by using the same in order to increase the correctness of the formed pattern.

According to one exemplary embodiment of the present invention, a mask is provided. The mask includes a substrate, at least a first strip pattern, at least a second strip pattern and an assist pattern. A width of the second strip pattern is substantially larger than a width of the first strip pattern, and the assist pattern is disposed in the second strip pattern neighboring the first strip pattern. The assist pattern does not overlap a center line of the second strip pattern.

According to another exemplary embodiment of the present invention, a method of forming a pattern includes the following steps. At first, a layout pattern is provided to a computer system. The layout pattern includes at least a first strip pattern and at least a second strip pattern, and a width of the second strip pattern is substantially larger than a width of the first strip pattern. Subsequently, the second strip pattern neighboring the first strip pattern is defined as a selected pattern. Then, an assist pattern is formed in the selected pattern, and the assist pattern does not overlap a center line of the selected pattern. The layout pattern and the assist pattern are further outputted through the computer system onto a mask.

The present invention provides a mask including the assist pattern having at least an opening and a method of forming a pattern by using the same mask. In order to prevent the loading effect, the assist pattern is disposed in the second strip pattern neighboring the first strip pattern, and the width of the second strip pattern is substantially larger than the width of the first strip pattern. The assist pattern could be used to make uniform quantity of light passing through two sides of the first strip pattern in the lithography process, accordingly, the correctness of the formed pattern corresponding to the first strip pattern neighboring the second strip pattern can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
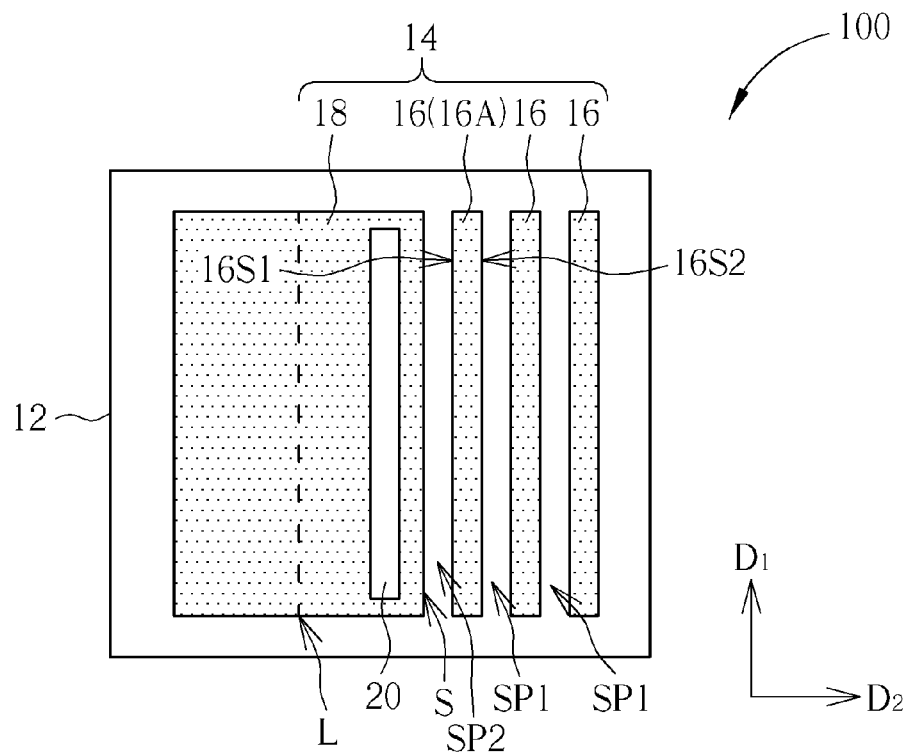
FIG. 1 is a schematic diagram illustrating a mask according to a first exemplary embodiment of the present invention.

The present invention provides a mask. Please refer to FIG. 1, which is a schematic diagram illustrating a mask according to a first exemplary embodiment of the present invention. As shown in FIG. 1, the mask 100 includes a substrate 12, a plurality of strip patterns 14 and an assist pattern 20. The substrate 12 includes transparent substrate such as glass substrate, quartz substrate, plastic substrate or substrate made of proper transparent materials. The strip patterns 14 disposed on the substrate 12 are made of opaque material such as chromium (Cr). The strip patterns 14 include a plurality of printable features, and the printable features may include feature patterns used to construct integrated circuit (IC) such as doped region patterns, device patterns, or line patterns. Furthermore, the strip patterns 14 include at least a first strip pattern 16 and at least a second strip pattern 18, a width of the second strip pattern 18 is substantially larger than a width of the first strip pattern 16, and the second strip pattern 18 has a center line L. The first strip patterns 16 and the second strip pattern 18 extend along a first direction D1, and the first strip patterns 16 and the second strip pattern 18 are arranged along a second direction D2 and parallel to each other, in which the first direction D1 is perpendicular to the second direction D2. The center line L of the second strip pattern 18 is parallel to the first direction D1, and the first strip patterns 16 are parallel to the center line L of the second strip pattern 18, but not limited thereto. The assist pattern 20 disposed in the second strip pattern 18 neighboring the first strip pattern 16A does not overlap the center line L of the second strip pattern 18, and the assist pattern 20 is preferably parallel to the center line L of the second strip pattern 18, but not limited thereto. In this exemplary embodiment, the assist pattern 20 including an opening pervious to light is disposed in the opaque second strip pattern 18, and a width along the second direction D2 of the cross-section of the assist pattern 20 is smaller than a predetermined value, i.e. the maximum size of the patterns in the mask 100 which could not be resolved through exposure process and development process, and larger than the exposure limit of the corresponding lithography process tool, i.e. the minimum size of the patterns which could be formed by the lithography process tool. More specifically, for the semiconductor process with critical dimension as 20 nanometers (nm), the maximum size of the patterns in the mask 100 which could not be resolved is substantially around 32 nm, and the exposure limit of the corresponding lithography process tool is substantially around 13 nm, accordingly, the width along the second direction D2 of the cross-section of the assist pattern 20 is substantially between 13 nm and 32 nm. In other words, the assist pattern 20 is a non-printable feature. More specifically, as the mask 10 is used in the lithography process performed on a light-sensitive material layer (not shown), only the patterns of the opaque first strip patterns 16 and the second strip pattern 18 are transferred to the material layer as a first pattern (not shown) and a second pattern (not shown), respectively. The second pattern corresponding to the second strip pattern 18 does not include the transferred pattern corresponding to the opening of the assist pattern 20. Moreover, the first gap (not shown) could be defined between the first pattern and the neighboring first pattern, i.e. each first gap respectively corresponds to each first space SP1 defined between the two first strip patterns 16 on the mask 100, and the second gap (not shown) could be defined between the first pattern and the neighboring second pattern, i.e. each second gap respectively corresponds to each second space SP2 defined between the first strip pattern 16 and the second strip pattern 18 on the mask 100.

It is appreciated that, the width of the first strip pattern 16 is different from the width of the second strip pattern 18, therefore, when the first strip pattern 16 and the second strip pattern 18 are exposed to light source such as KrF having a wavelength of 248 nanometer (nm) or deep ultraviolet (Deep UV) having a wavelength of 193 nanometer (nm) in the following lithography process, on the material layer, the maximum light intensity of light received by each first gap is different from the maximum light intensity of the light received by the second gap, that is to say that the light intensity of the light received at a side of the first pattern transferred from the first strip pattern 16A may be different from that at the other opposite side of the same first pattern, which may cause deformations in the first pattern. Accordingly, in this exemplary embodiment, the light transmissive assist pattern 20 is entirely disposed in the opaque second strip pattern 18 neighboring the first strip pattern 16A, i.e. the opaque material of the second strip pattern 18 surrounds the assist pattern 20. Furthermore, the assist pattern 20 as non-printable feature is only used to adjust the maximum light intensity of the light received by the second gap without being transferred to the material layer, so that the difference of the light intensity between the two sides of the first pattern transferred from the first strip pattern 16A could be further reduced, and the deformation of the first pattern may be avoided.

Please refer to FIG. 1 again, in this exemplary embodiment, the assist pattern 20 includes an opening, and the opening includes at least a geometric pattern such as rectangular pattern. The assist pattern 20, preferably parallel to the first strip pattern 16, extends along the first direction D1. The light from the light source applied in the following lithography process preferably passes through the mask 100 along a direction perpendicular to the surface of the paper for a better resolution of the transferred patterns, but not limited thereto. The assist pattern 20 disposed in the second strip pattern 18 is close to a side S of the second strip pattern 18, and the side S neighboring the first strip pattern 16A. The assist pattern 20 is used to adjust the light intensity of the light received by the second gap; in other words, the difference between the maximum light intensity of the light received by the second gap and the minimum light intensity of the light received by the first pattern could be substantially the same as the difference between the maximum light intensity of the light received by the first gap and the minimum light intensity of the light received by the first pattern. Moreover, the deviation of the light intensity of the received light between a side of the first pattern transferred from a side 16S1 of the first strip pattern 16A and the other side of the first pattern transferred from the other side 16S2 of the first strip pattern 16A may be reduced, which is beneficial to the integrity of the first pattern on the material layer and transferred from the first strip pattern 16A neighboring the second strip pattern 18.

The line width and the optical design condition may influence the size of the formed patterns according to the different methods or formulas, therefore, the size range of the assist pattern 20 disposed in the opaque second strip pattern 18 may be adjusted according to the line width of the other formed patterns and the optical design condition. The size, the shape, the quantity and the arrangement of the assist pattern 20 not limited to the illustrated embodiment may be modified according to the process requirements. In other exemplar embodiments, the assist pattern may include an opening having the different geometric pattern, or a plurality of openings. The other exemplar embodiments are illustrated below, and in order to simplify the explanation, the same components are referred by using the same numerals as before, and only the differences are discussed while the similarities are not mentioned again.

Figure 2:
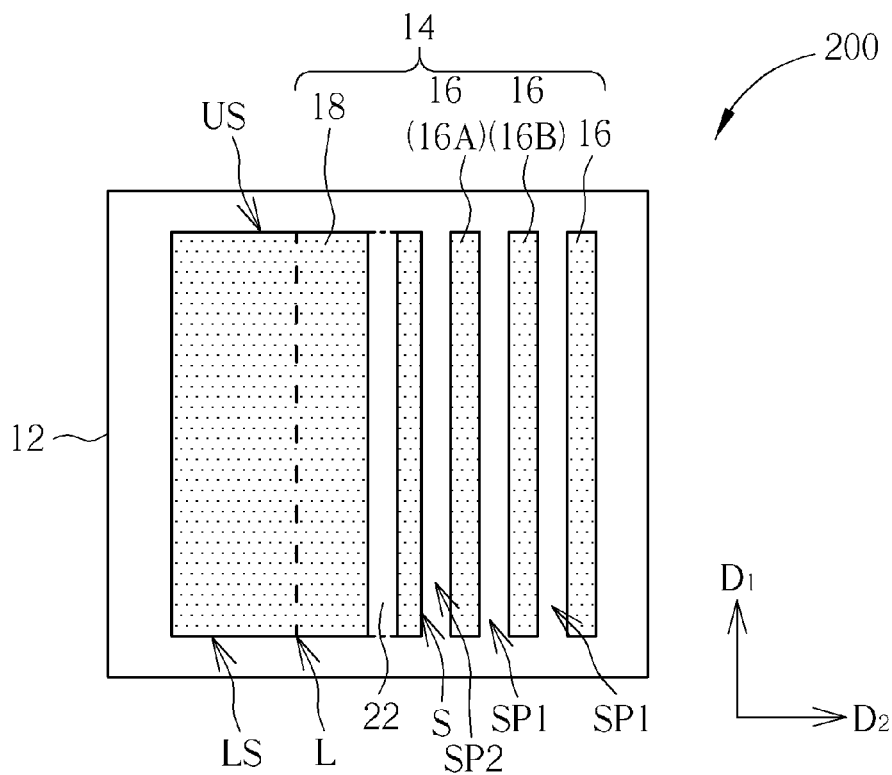
FIG. 2 is a schematic diagram illustrating a mask according to a second exemplary embodiment of the present invention.

Please refer to FIG. 2, which is a schematic diagram illustrating a mask according to a second exemplary embodiment of the present invention. As shown in FIG. 2, the mask 200 includes the substrate 12, the first strip pattern 16A arranged between the first strip pattern 16B and the second strip pattern 18, and an assist pattern 22 disposed in the second strip pattern 18. The assist pattern 22 does not overlap the center line L of the second strip pattern 18, and is preferably parallel to the center line L of the second strip pattern 18. Compared to the first exemplary embodiment, the assist pattern 22 of the second exemplary embodiment includes an opening contacting the upper side US and the lower side LS of the second strip pattern 18, i.e. the non-closed pattern may be also feasible to make uniform the light intensity of the light received at the two sides of the first pattern transferred from the two sides of the first strip pattern 16A.

Figure 3:
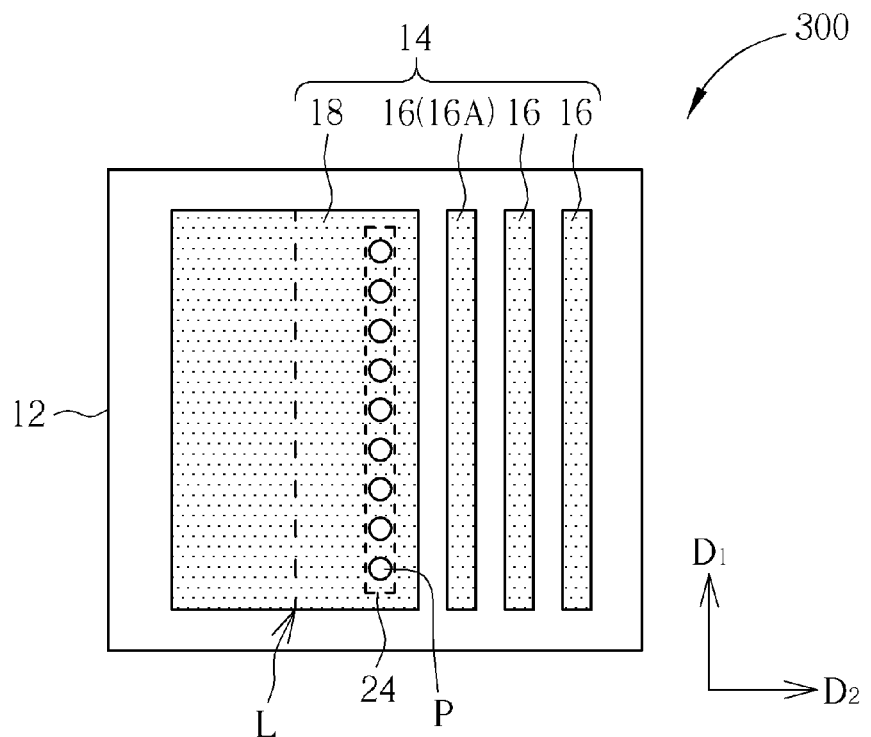
FIG. 3 is a schematic diagram illustrating a mask according to a third exemplary embodiment of the present invention.

Please refer to FIG. 3, which is a schematic diagram illustrating a mask according to a third exemplary embodiment of the present invention. As shown in FIG. 3, the mask 300 includes the substrate 12, a plurality of the first strip patterns 16, the second strip pattern 18 neighboring the first strip pattern 16A, and an assist pattern 24 disposed in the second strip pattern 18. Compared to the first exemplary embodiment, the assist pattern 24 of the third exemplary embodiment incudes a plurality of openings P, and each opening P has a geometric pattern such as a circular pattern. The openings P are arranged along the first direction D1 and parallel to the centerline L of the second strip pattern 18. In this exemplary embodiment, the assist pattern 24 includes a plurality of the same patterns, i.e. the assist pattern 24 includes the openings P and each opening P has the same circular pattern. In other exemplary embodiments, each opening of the assist pattern may respectively have its own pattern such as a triangular pattern, a parallelogram pattern, a diamond pattern or a square pattern.

Figure 4:
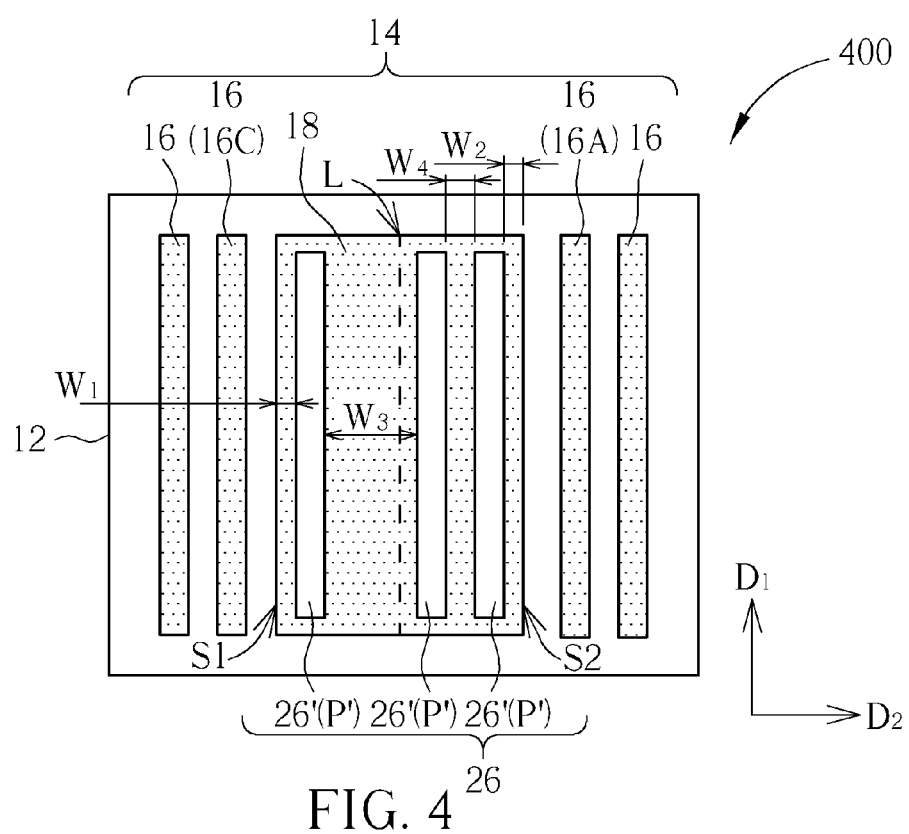
FIG. 4 is a schematic diagram illustrating a mask according to a fourth exemplary embodiment of the present invention.

Please refer to FIG. 4, which is a schematic diagram illustrating a mask according to a fourth exemplary embodiment of the present invention. As shown in FIG. 4, the mask 400 includes the substrate 12, a plurality of first strip patterns 16, at least a second strip pattern 18 between the first strip patterns 16A/16C, and an assist pattern 26 disposed in the second strip pattern 18. As illustrated above, the second strip pattern 18 neighboring the first strip patterns 16A/16C may induce different quantity of light passing through the two sides of each of the first strip patterns 16A/16C during the lithography process, so that the light intensity of the light received by the two sides of each of the first strip patterns 16A/16C may be different, and the deformation in the first patterns transferred from the first strip patterns 16A/16C may also occur. Accordingly, the assist pattern 26 is disposed in the second strip pattern 18 to ensure the pattern of each of the first strip patterns can be completely transferred to the material layer as the first patterns. In this exemplary embodiment, the assist pattern 26 includes a plurality of openings P', each opening P' has a geometric pattern such as a rectangular pattern, and the openings P' do not overlap the center line L of the second strip pattern 18. Compared to the third exemplary embodiment, the assist pattern 26 of the fourth exemplary embodiment includes a plurality of sub-assist patterns 26' defined therein. The sub-assist pattern 26' respectively includes one opening P', and the openings P' are arranged in an unfixed interval along the second direction D2. Each sub-assist patterns 26' is parallel to the center line L of the second strip pattern 18. The assist pattern 26 is used to adjust the quantity of light received by the second gap between the formed first pattern and the formed second pattern, in other words, the difference between the maximum light intensity of the light received by the second gap and the minimum light intensity of the light received by the formed first pattern could be substantially the same as the difference between the maximum light intensity of the light received by the first gap and the minimum light intensity of the light received by the formed first pattern, which may be beneficial to keep the complete pattern of the first patterns transferred from the corresponding first strip patterns 16A/16C. It is appreciated that, the interval W1/W2 between the side S1/S2 of the second strip pattern 18 and the assist pattern 26, and the interval W3/W4 between the sub-assist patterns 26' could be adjustable to ensure that the maximum light intensity of the light received by the second gap may be the same as the maximum light intensity of the light received by the first gap.

Figure 5:
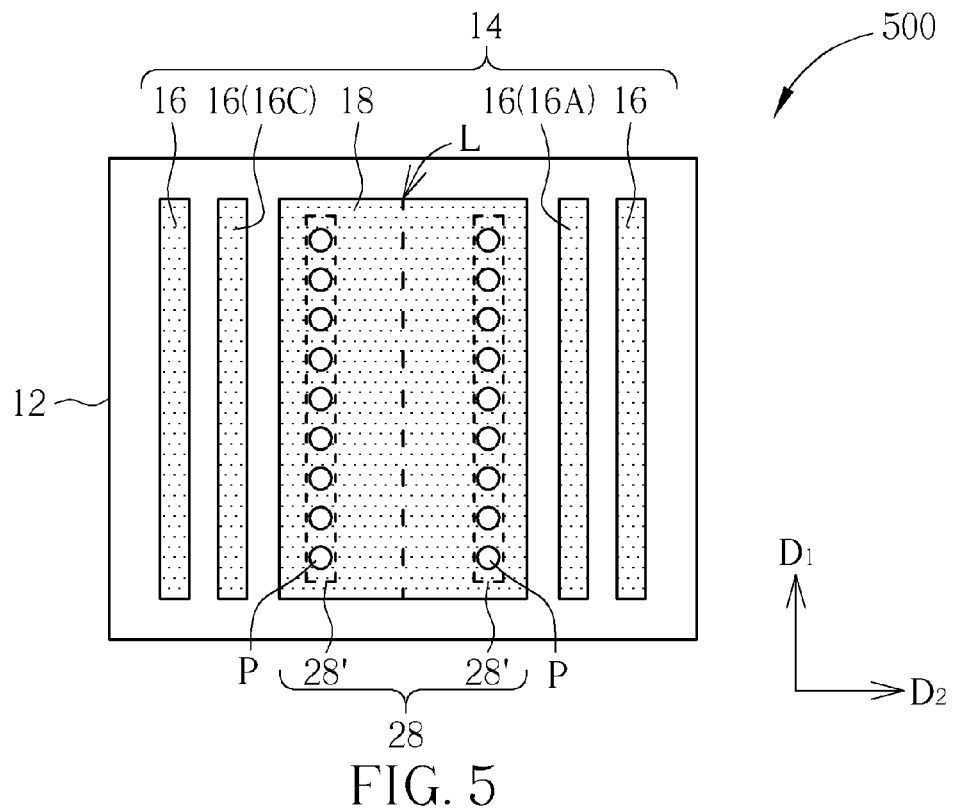
FIG. 5 is a schematic diagram illustrating a mask according to a fifth exemplary embodiment of the present invention.

Similarly, please refer to FIG. 5, which is a schematic diagram illustrating a mask according to a fifth exemplary embodiment of the present invention. As shown in FIG. 5, the mask 500 includes the substrate 12, a plurality of first strip patterns 16, at least a second strip pattern 18 between the first strip patterns 16A/16C, and an assist pattern 28 disposed in the second strip pattern 18. In this exemplary embodiment, the assist pattern 28 includes a plurality of openings P, each opening P has a geometric pattern such as a circular pattern, and the openings P do not overlap the center line L of the second strip pattern 18. The assist pattern 28 includes a plurality of sub-assist patterns 28' defined therein, and the sub-assist patterns 28' are arranged in an unfixed interval along the second direction D2. Furthermore, the sub-assist patterns 28' are preferably parallel to the center line L of the second strip pattern 18. Compared to the fourth exemplary embodiment, in the fifth exemplary embodiment, each of the sub-assist patterns 28' includes a plurality of openings P, and the openings P are disposed along the first direction D1.

Figure 6:
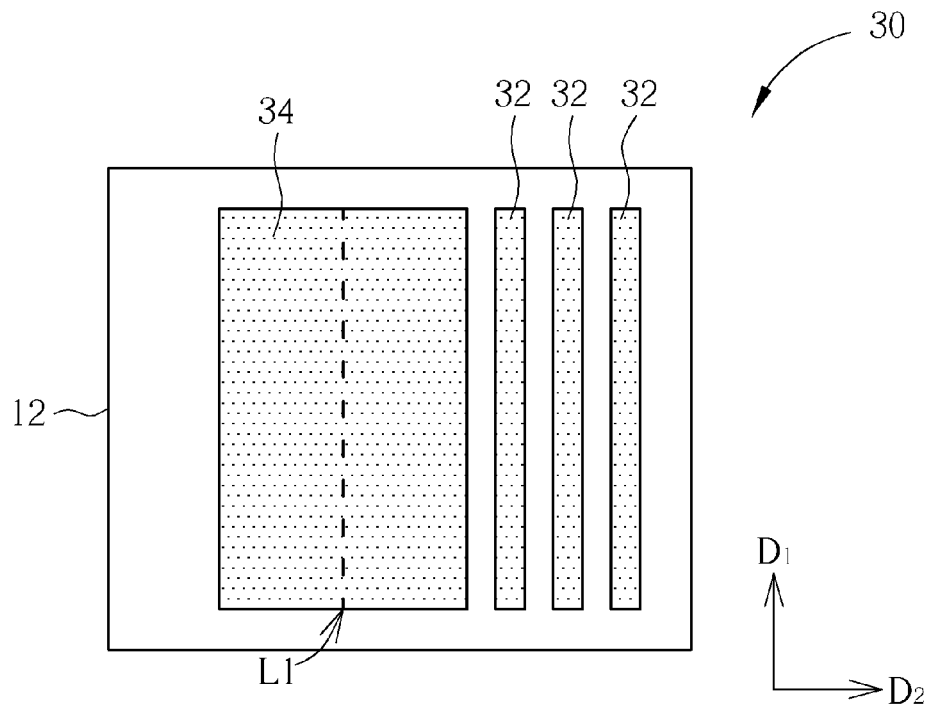
FIG. 6 through FIG. 10 are schematic diagrams illustrating a method of forming a pattern according to a preferred exemplary embodiment of the present invention.

The present invention also provides a method of forming a pattern. Please refer to FIG. 6 through FIG. 10. FIG. 6 through FIG. 10 are schematic diagrams illustrating a method of forming a pattern according to a preferred exemplary embodiment of the present invention. As shown in FIG. 6, at first, a layout pattern 30 is provided, for example, the layout pattern 30 is provided to a computer system (not shown). The layout pattern 30 includes a plurality of printable features, and the printable features may include feature patterns used to construct integrated circuits such as doped region patterns, device patterns, or line patterns. In this exemplary embodiment, the layout pattern 30 includes at least a second strip pattern 34 and a plurality of first strip patterns 32 arranged at a side of the second strip pattern 34. The second strip pattern 34 and the first strip patterns 32 are printable features, and a width of the second strip pattern 34 is substantially larger than a width of the first strip pattern 32. Each of the first strip patterns 32 and the second strip pattern 34 extend along a first direction D1, and first strip patterns 32 and the second strip pattern 34 are arranged along a second direction D2 and parallel to each other, in which the first direction D1 is perpendicular to the second direction D2. A center line L1 of the second strip pattern 34 is parallel to the first direction D1, and each of the first strip patterns 32 is parallel to the center line L1 of the second strip pattern 34, but not limited thereto.

Figure 7:
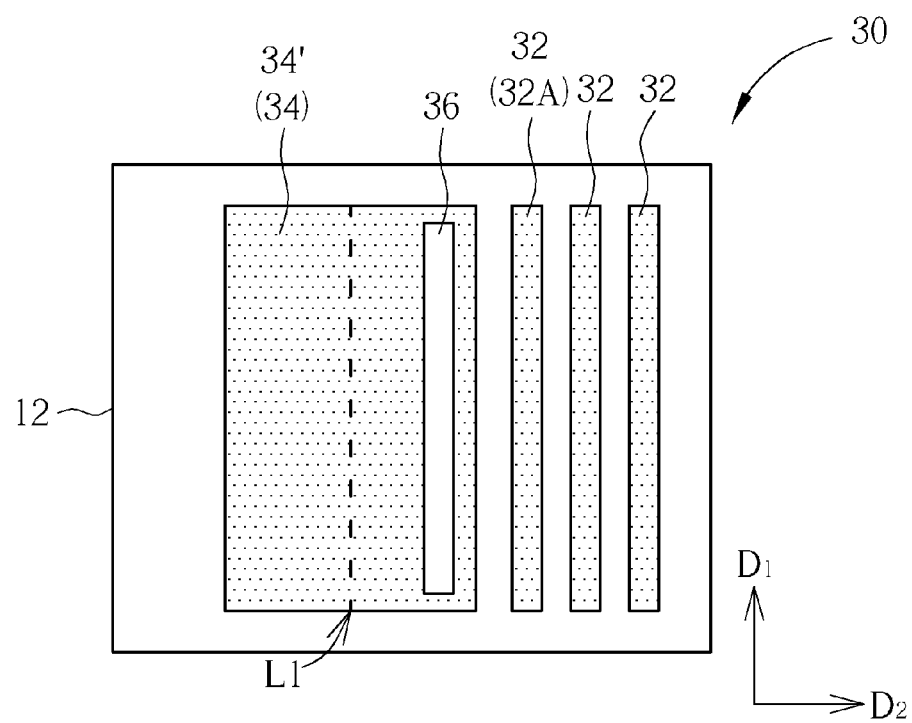
Figure 8:
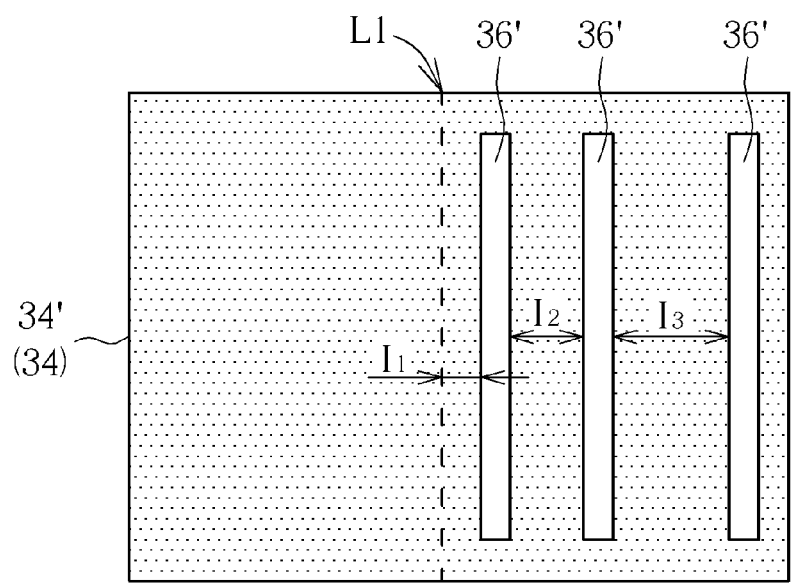
Figure 9:
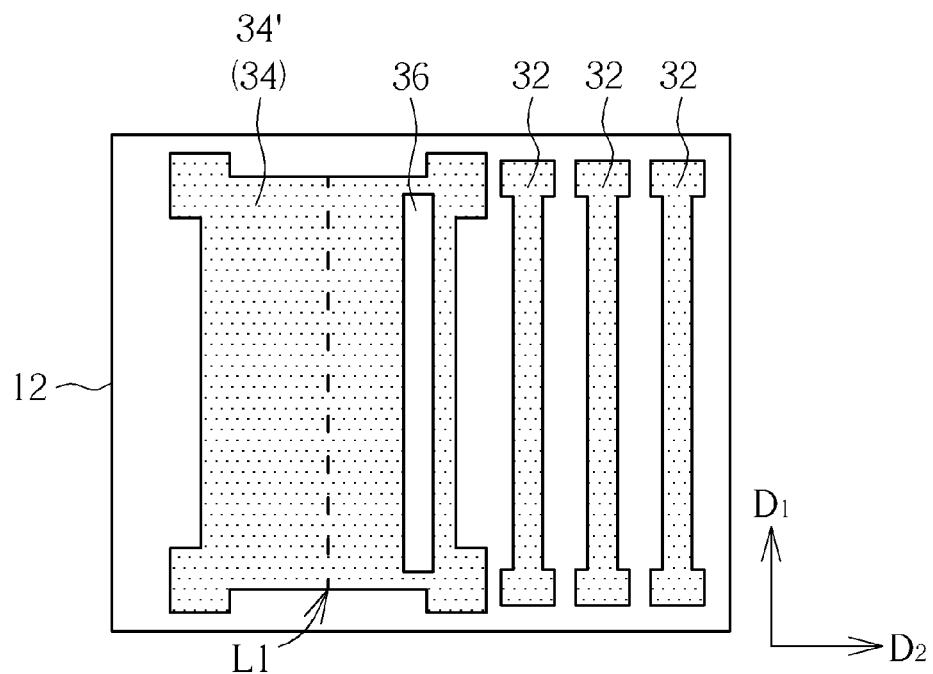

Subsequently, as shown in FIG. 7, in the layout pattern 30, the second strip pattern 34 neighboring the first strip pattern 32A is chosen and defined as a selected pattern 34', and an assist pattern 36 as non-printable feature is formed in the selected pattern 34'. The assist pattern 36 does not overlap the center line L1 of the selected pattern 34', and the assist pattern 36 is preferably parallel to the center line L1 of the selected pattern 34'. The assist pattern 36 includes at least an opening, and the opening includes a geometric pattern such as a rectangular pattern, a circular pattern, a triangular pattern, a parallelogram pattern, a diamond pattern or a square pattern. The disposition of the assist pattern 36 may be referred to the illustrated exemplary embodiments. For example, the assist pattern may include a single opening (as illustrated in the first exemplary embodiment and the second exemplary embodiment), or a plurality of openings (as illustrated in the third exemplary embodiment). Furthermore, a width along the second direction D2 of the assist pattern 36 is smaller than the size of the minimum exposure limit of the corresponding lithography process, in other words, the assist pattern 36 is a non-printable feature. In this exemplary embodiment, the assist pattern 36 includes an opening having a rectangular pattern. In other exemplary embodiments, the assist pattern may include a plurality of sub-assist patterns 36' arranged in an unfixed interval and parallel to each other, or having a gradually decreasing width toward the center line L1, or having a gradually decreasing interval I1/I2/I3 toward the center line L1 as shown in FIG. 8. Each sub-assist pattern may include a single opening (as illustrated in the fourth exemplary embodiment), or a plurality of openings (as illustrated in the fifth exemplary embodiment). Moreover, a method of optical proximity correction (OPC) could be optionally further performed to each of the first strip patterns 32 and the second strip pattern 34, as shown in FIG. 9.

Figure 10:
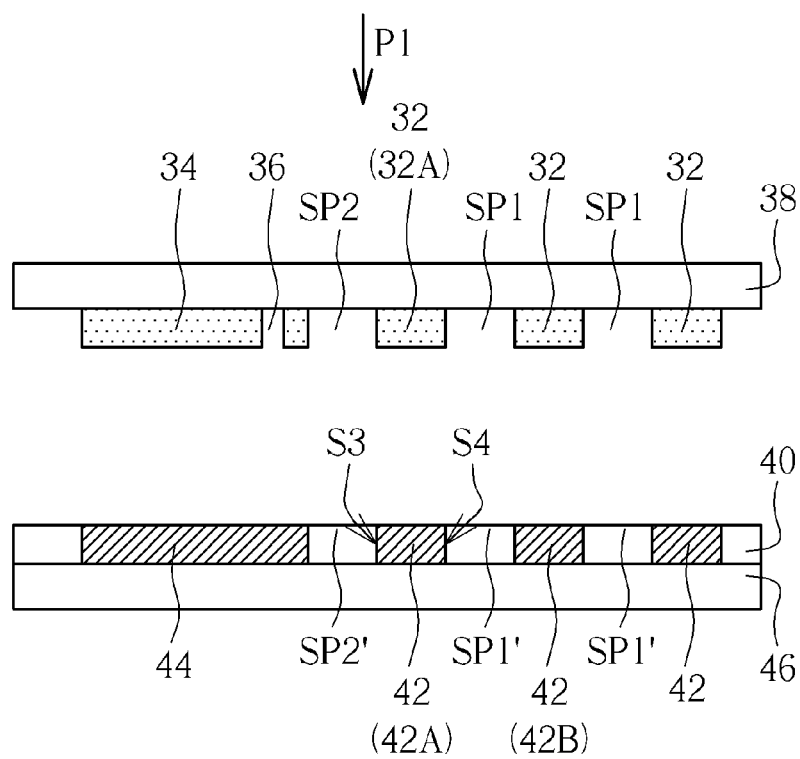

As shown in FIG. 10, the layout pattern 30 including the first strip patterns 32 and the second strip pattern 34, and the assist pattern 36 are outputted through the computer system onto a mask 38. Furthermore, the first space SP1 could be defined between the two neighboring first strip patterns 32, and the second space SP2 could be defined between the first strip pattern 32 and the second strip pattern 34. The layout pattern 30 may be further transferred from the mask 38 to a material layer 40 through a lithography process P1 with the mask 38. The lithography process P1 is performed to form the first patterns 42 and the second pattern 44 respectively corresponding to the first strip patterns 32 and the second strip pattern 34 of the mask 38 on the material layer 40. The material layer 40 including a photoresist material layer could be disposed on the semiconductor substrate 46. In the mask 38, the assist pattern 36 is disposed in the selected pattern 34', i.e. the assist pattern 36 is disposed in the second strip pattern 34 neighboring the first strip pattern 32A, in order to adjust the quantity of light passing through a side of the first strip pattern 32A i.e. the second space SP2 in the lithography process P1, so that the quantity of light passing through the second space SP2 could be the same as the quantity of light passing through the first space SP1. Accordingly, on the material layer 40, the maximum light intensity of the light received by the first gap SP1' between the first pattern 42A and the first pattern 42B may be substantially the same as the maximum light intensity of the light received by the second gap SP2' between the first pattern 42A and the second pattern 44. In other words, the light intensity of the light received at two sides S3/S4 of the first pattern 42A transferred from the first strip pattern 32A may be the same, therefore, the influence of the micro-loading effect could be avoided and the complete transferred first pattern 42A could be obtained.

In conclusion, the present invention provides a mask including the assist pattern having at least an opening and a method of forming a pattern by using the same mask. In order to prevent the loading effect, the assist pattern is disposed in the second strip pattern neighboring the first strip pattern, and the width of the second strip pattern is substantially larger than the width of the first strip pattern. The assist pattern could be used to make uniform quantity of light passing through two sides of the first strip pattern in the lithography process, accordingly, the correctness of the formed pattern corresponding to the first strip pattern neighboring the second strip pattern can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a pattern, comprising:
providing a layout pattern to a computer system, wherein the layout pattern comprises at least a first strip pattern and at least a second strip pattern, and a width of the second strip pattern is substantially larger than a width of the first strip pattern;
defining the second strip pattern neighboring the first strip pattern as a selected pattern;
forming an assist pattern in the selected pattern, wherein the assist pattern does not overlap a center line of the selected pattern and is completely surrounded by the selected pattern; and
outputting the layout pattern and the assist pattern through the computer system onto a mask.

2. The method of forming a mask pattern according to claim 1, further comprising transferring the layout pattern from the mask to a material layer through a lithography process with the mask.

3. The method of forming a mask pattern according to claim 1, wherein the first strip pattern is parallel to a center line of the second strip pattern.

4. The method of forming a mask pattern according to claim 1, wherein the assist pattern is parallel to the center line of the selected pattern.

5. The method of forming a mask pattern according to claim 1, wherein the assist pattern comprises at least an opening.

6. The method of forming a mask pattern according to claim 1, wherein the first strip pattern and the second strip pattern extending along a first direction are arranged along a second direction and parallel to each other, a center line of the second strip pattern is parallel to the first direction, and the first direction is perpendicular to the second direction.

7. The method of forming a mask pattern according to claim 6, wherein a width along the second direction of the cross-section of the assist pattern is smaller than a predetermined value, and the predetermined value is the maximum size of patterns in the mask which could not be resolved through exposure process and development process.

8. The method of forming a mask pattern according to claim 7, wherein the predetermined value is substantially 32 nanometers (nm).

9. The method of forming a mask pattern according to claim 6, wherein the assist pattern comprises a plurality of openings, the openings are arranged in an unfixed interval along the second direction.

* * * * *